US010115480B1

(12) United States Patent
Gamini et al.

(10) Patent No.: US 10,115,480 B1
(45) Date of Patent: Oct. 30, 2018

(54) DOUBLE DATA RATE SYNCHRONOUS DYNAMIC RANDOM ACCESS MEMORY ("DDR SDRAM") DATA STROBE SIGNAL CALIBRATION

(71) Applicant: QUALCOMM INCORPORATED, San Diego, CA (US)

(72) Inventors: Lakshmi Neeharika Gamini, Bangalore (IN); Sanku Mukherjee, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/640,855

(22) Filed: Jul. 3, 2017

(51) Int. Cl.
G11C 29/50 (2006.01)
G11C 29/38 (2006.01)
G11C 29/12 (2006.01)
G11C 11/4076 (2006.01)
G11C 11/409 (2006.01)

(52) U.S. Cl.
CPC ...... *G11C 29/50012* (2013.01); *G11C 11/409* (2013.01); *G11C 11/4076* (2013.01); *G11C 29/12015* (2013.01); *G11C 29/38* (2013.01)

(58) Field of Classification Search
CPC .......... G11C 29/50012; G11C 11/4076; G11C 11/409; G11C 29/12015; G11C 29/38
USPC ........ 714/721, 718, 704, 742, 744; 365/200, 365/201
See application file for complete search history.

(56) References Cited

U.S. PATENT DOCUMENTS

| 6,137,734 | A | 10/2000 | Schoner et al. |
| 6,609,167 | B1 * | 8/2003 | Bastiani ............... G06F 13/4291 710/10 |
| 6,671,211 | B2 * | 12/2003 | Borkenhagen ....... G11C 7/1078 365/189.05 |
| 6,807,650 | B2 | 10/2004 | Lamb et al. |
| 6,894,945 | B2 | 5/2005 | Sawada |
| 7,620,515 | B2 | 11/2009 | Heinen et al. |
| 7,634,698 | B2 | 12/2009 | Wang |
| 8,692,600 | B1 | 4/2014 | Blanco et al. |
| 9,805,759 | B1 * | 10/2017 | Kishino ................... G11B 5/09 |
| 2005/0105349 | A1 * | 5/2005 | Dahlberg ............. G11C 7/1078 365/201 |

(Continued)

FOREIGN PATENT DOCUMENTS

JP 2011061666 A 3/2011

OTHER PUBLICATIONS

International Search Report and Written Opinion—PCT/US2018/029159—ISA/EPO—dated Jul. 23, 2018.

*Primary Examiner* — John J Tabone, Jr.
(74) *Attorney, Agent, or Firm* — Smith Tempel Blaha LLC

(57) ABSTRACT

In calibrating the phase skew between an SDRAM data strobe ("DQS") signal and data ("DQ") signal in a device, the data signal driver circuit impedance is adjusted to impair impedance matching on the DQ signal channel while system-level memory tests are performed. The phase skew is stepped through a range during the memory tests, and an error count is determined for each test. The memory tests may emulate mission-mode operation of the device. Following the memory tests, an optimal phase skew corresponding to a lowest error count is determined. The DQS signal may be delayed with respect to the DQ signals by a value corresponding to the optimal phase skew in subsequent mission-mode operation of the device.

30 Claims, 7 Drawing Sheets

(56) References Cited

U.S. PATENT DOCUMENTS

| | | | |
|---|---|---|---|
| 2006/0041772 A1* | 2/2006 | Doi | G01R 31/3191 |
| | | | 713/500 |
| 2007/0074061 A1* | 3/2007 | Lin | G06F 13/4072 |
| | | | 713/500 |
| 2008/0002514 A1* | 1/2008 | Oh | G11C 7/1051 |
| | | | 365/233.1 |
| 2010/0202223 A1* | 8/2010 | Kuroki | G11C 7/1006 |
| | | | 365/193 |
| 2015/0066819 A1 | 3/2015 | Mozak et al. | |
| 2017/0054549 A1 | 2/2017 | Stott et al. | |
| 2018/0144786 A1* | 5/2018 | Lim | G06F 11/1068 |

* cited by examiner

DOUBLE DATA RATE SYNCHRONOUS DYNAMIC RANDOM ACCESS MEMORY ("DDR SDRAM") DATA STROBE SIGNAL CALIBRATION

DESCRIPTION OF THE RELATED ART

A computing device, such as a desktop, laptop, or tablet computer, smartphone, portable digital assistant, portable game console, etc., includes one or more processors, such as central processing units, graphics processing units, digital signal processors, etc., as well as one or more memories. To promote high throughput, such a memory may be of a type capable of high-speed operation, such as double data rate synchronous dynamic random access memory ("DDR SDRAM").

Synchronous DRAMs, or SDRAMs utilize a source-synchronous memory interface, in which the source of a data ("DQ") signal during a data transfer is relied upon to provide a data strobe ("DQS") signal that is used by the target of the data transfer to capture such a data signal as it is being transferred over a data line (channel) to the target. In DDR SDRAM, the DQ signal is sampled, i.e., latched, at the target by both the rising and falling edges of the DQS signals.

Dense routing of circuit traces may promote crosstalk among adjacent traces, including those carrying the DQ and DQS signals. Impedance mismatches may also produce adverse effects upon the DQ and DQS signals, such as ring-back noise. Crosstalk, ring-back noise, and other adverse effects may induce data errors in the memory system. Sampling the DQ signal at a point in time at which it has maximal integrity promotes low data error rates.

Signal integrity may be characterized by a so-called eye diagram. A straightforward, conventional DQ signal sampling technique is based upon an assumption that a DQ signal has maximum signal integrity at the center of the eye. Accordingly, in such a conventional technique, the DQS signal is delayed with respect to the DQ signals to provide a 90-degree phase skew between them, so that the DQ signal is sampled at the center of the eye. This technique may fail to minimize data errors because effects such as ring-back noise may impair DQ signal integrity at the center of the eye.

A more sophisticated conventional DQ signal sampling technique is based upon a calibration procedure. In the calibration procedure, the phase skew between the DQS and DQ signal is stepped through a range of values between 0 and 180 degrees. For each value of DQS-DQ phase skew, data are written to the DRAM and read back from the DRAM, and the number of errors counted. In this manner, a histogram is generated that indicates the DQS-DQ phase skew value at which the error count was lowest. The memory interface is then set or programmed with this DQS-DQ phase skew value, so that in the normal or so-called mission mode operation of the computing device the memory interface uses this value in write operations. Although this technique may improve upon the straightforward technique described above, effects such as crosstalk may nevertheless induce data errors during mission-mode operation.

SUMMARY OF THE DISCLOSURE

Systems, methods, and computer program products are disclosed for controlling calibration of a synchronous dynamic random access memory ("SDRAM") system.

In one aspect, a method may include adjusting a data signal driver circuit to impair impedance matching on a data signal channel during a plurality of system-level memory tests, and performing the plurality of system-level memory tests using a memory controller and an SDRAM. Each memory test may correspond to one of a plurality of phase skew values between a data strobe signal and a data signal on the data signal channel. Each memory test may include setting a data strobe signal delay for the memory controller to correspond to one of the plurality of the phase skew values, writing a plurality of data words to the SDRAM over the data signal channel, reading the plurality of data words from the SDRAM over the data signal channel, and determining an error count for the memory test. The error count indicates data mismatch errors between the plurality of data words read from the SDRAM and the plurality of data words written to the SDRAM. The method may further include, following the plurality of system-level memory tests, determining, an optimal phase skew value corresponding to a lowest error count among the plurality of system-level memory tests, and setting a data strobe signal delay for the memory controller to correspond to the optimal phase skew value.

In another aspect, a system for calibrating a memory system may include a memory system comprising a memory controller and an SDRAM. The system may further include one or more processors configured to adjust a data signal driver circuit to impair impedance matching on a data signal channel during a plurality of system-level memory tests, and perform the plurality of system-level memory tests. Each memory test may correspond to one of a plurality of phase skew values between a data strobe signal and a data signal on the data signal channel. The one or more processors may be configured to, for each memory test, set a data strobe signal delay for the memory controller to correspond to one of the plurality of the phase skew values, write a plurality of data words to the SDRAM over the data signal channel, read the plurality of data words from the SDRAM over the data signal channel, determine an error count for the memory test. The error count indicates data mismatch errors between the plurality of data words read from the SDRAM and the plurality of data words written to the SDRAM. The one or more processors may further be configured to, following the plurality of system-level memory tests, determine, an optimal phase skew value corresponding to a lowest error count among the plurality of system-level memory tests, and set the data strobe signal delay for the memory controller to correspond to the optimal phase skew value.

In still another aspect, a computer program product for controlling memory system calibration may include processor-executable logic embodied in at least one non-transitory storage medium. Execution of the logic by one or more processors of a system may configure the system to adjust a data signal driver circuit to impair impedance matching on a data signal channel during a plurality of system-level memory tests, perform the plurality of system-level memory tests using a memory controller and an SDRAM. Each memory test may correspond to one of a plurality of phase skew values between a data strobe signal and a data signal on the data signal channel. Execution of the logic by the one or more processors may configure the system to, for each memory test, set a data strobe signal delay for the memory controller to correspond to one of the plurality of the phase skew values, write a plurality of data words to the SDRAM over the data signal channel, read the plurality of data words from the SDRAM over the data signal channel, and determine an error count for the memory test. The error count indicates data mismatch errors between the plurality of data words read from the SDRAM and the plurality of data words written to the SDRAM. Execution of the logic by the one or more processors may further configure the system to, following the plurality of system-level memory tests, determine an optimal phase skew value corresponding to a lowest error count among the plurality of system-level memory tests, and set the data strobe signal delay for the memory controller to correspond to the optimal phase skew value.

BRIEF DESCRIPTION OF THE DRAWINGS

In the Figures, like reference numerals refer to like parts throughout the various views unless otherwise indicated. For reference numerals with letter character designations such as "102A" or "102B", the letter character designations may differentiate two like parts or elements present in the same Figure. Letter character designations for reference numerals may be omitted when it is intended that a reference numeral to encompass all parts having the same reference numeral in all Figures.

DETAILED DESCRIPTION

Figure 1:
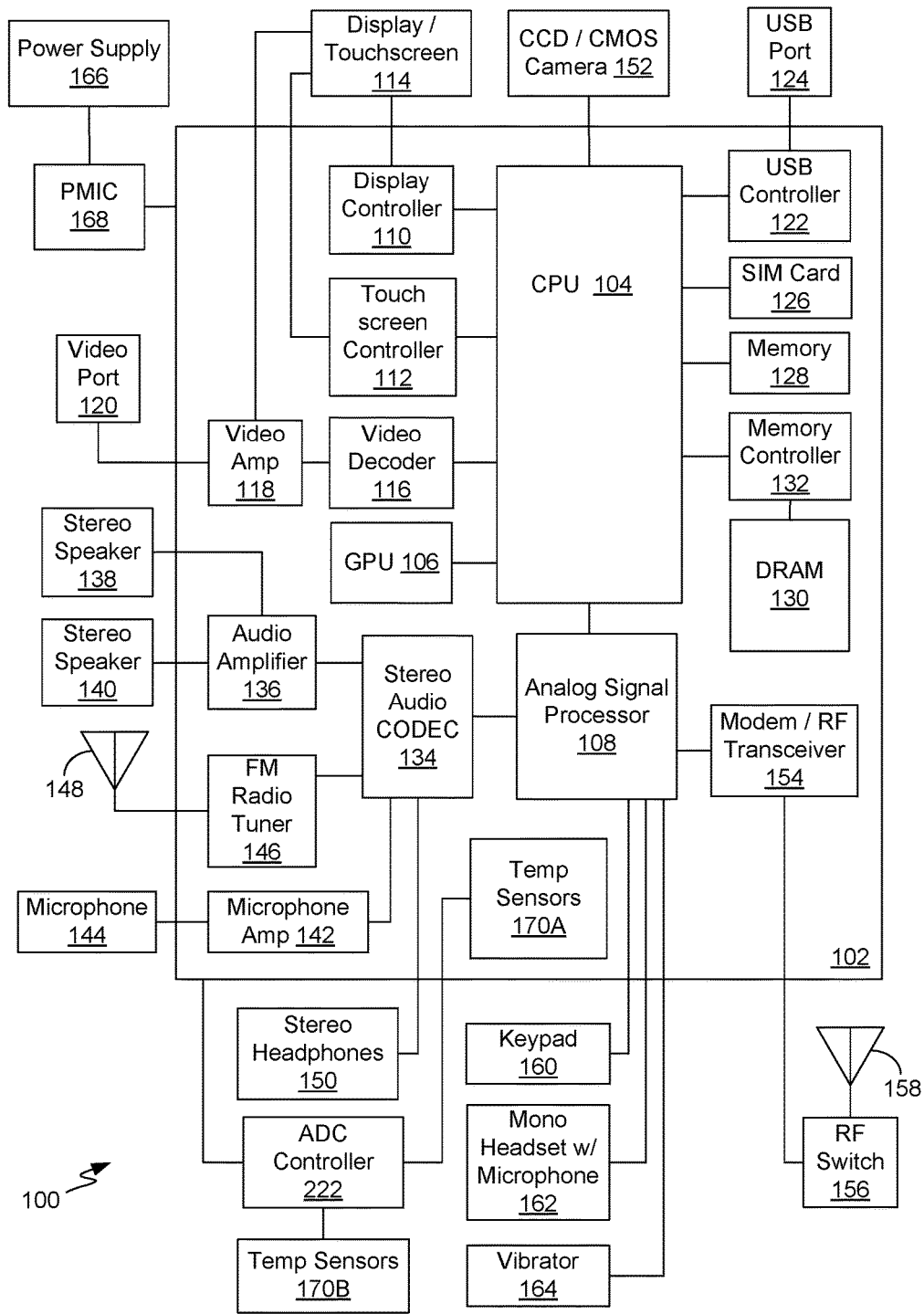
FIG. 1 is a block diagram of a portable computing device, in accordance with an exemplary embodiment.

The word "exemplary" is used herein to mean "serving as an example, instance, or illustration." Any aspect described herein as "exemplary" is not necessarily to be construed as preferred or advantageous over other aspects.

A reference herein to "SDRAM" or "DDR" memory components will be understood to envision any of a broader class of synchronous dynamic random access memory ("SDRAM") and will not limit the scope of the solutions disclosed herein to a specific type or generation of SDRAM. Moreover, certain embodiments of the solutions disclosed herein may be applicable to DDR, DDR-2, DDR-3, low power DDR ("LPDDR") or any subsequent generation of SDRAM.

The terms "central processing unit" ("CPU"), "digital signal processor" ("DSP"), and "graphics processing unit" ("GPU") are non-limiting examples of processors that may reside in a PCD. These terms are used interchangeably herein except where otherwise indicated.

The term "portable computing device" ("PCD") is used herein to describe any device operating on a limited capacity power supply, such as a battery. Although battery operated PCDs have been in use for decades, technological advances in rechargeable batteries coupled with the advent of third generation ("3G") and fourth generation ("4G") wireless technology have enabled numerous PCDs with multiple capabilities. Therefore, a PCD may be a cellular or mobile telephone, a satellite telephone, a pager, a personal digital assistant ("PDA"), a smartphone, a navigation device, a smartbook or reader, a media player, a combination of the aforementioned devices, a laptop or hand-held computer with a wireless connection or link, among others.

The terms "component," "database," "module," "system," and the like are used herein to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes, such as in accordance with a signal having one or more data packets (e.g., data from one component interacting with another component in a local system, distributed system, and/or across a network such as the Internet with other systems by way of the signal).

The terms "application" or "application program" may be used synonymously to refer to a software entity having executable content, such as object code, scripts, byte code, markup language files, patches, etc. In addition, an "application" may further include files that are not executable in nature, such as data files, configuration files, documents, etc.

As illustrated in FIG. 1, in illustrative or exemplary embodiments, systems, methods, and computer program products for memory system calibration may be embodied in a PCD 100. PCD 100 includes a system on chip ("SoC") 102, i.e., a system embodied in an integrated circuit chip. SoC 102 may include a central processing unit ("CPU") 104, a graphics processing unit ("GPU") 106, or other processors. PCD 102 may include an analog signal processor 108.

A display controller 110 and a touchscreen controller 112 may be coupled to CPU 104. A touchscreen display 114 external to SoC 102 may be coupled to display controller 110 and touchscreen controller 112. PCD 102 may further include a video decoder 116. Video decoder 116 is coupled to CPU 104. A video amplifier 118 may be coupled to video decoder 116 and touchscreen display 114. A video port 120 may be coupled to video amplifier 118. A universal serial bus ("USB") controller 122 may also be coupled to CPU 104, and a USB port 124 may be coupled to USB controller 122. A subscriber identity module ("SIM") card 126 may also be coupled to CPU 104.

One or more memories may be coupled to CPU 104. The one or more memories may include both volatile and non-volatile memories, such as a flash memory 128 and a DDR SDRAM 130, respectively. In other embodiments, additional memory, such as additional DDR SDRAM, may be included externally to SoC 102. A memory controller 132 coupled to CPU 104 controls the writing of data to, and reading of data from, DDR SDRAM 130. In other embodiments, such a memory controller may be included within a processor, such as CPU 104.

A stereo audio CODEC 134 may be coupled to analog signal processor 108. Further, an audio amplifier 136 may be coupled to stereo audio CODEC 134. First and second stereo speakers 138 and 140, respectively, may be coupled to audio amplifier 136. In addition, a microphone amplifier 142 may be also coupled to stereo audio CODEC 134, and a microphone 144 may be coupled to microphone amplifier 142. A frequency modulation ("FM") radio tuner 146 may be coupled to stereo audio CODEC 134. An FM antenna 148 may be coupled to the FM radio tuner 146. Further, stereo headphones 150 may be coupled to stereo audio CODEC 134. Other devices that may be coupled to CPU 104 include a digital camera 152.

A modem or radio frequency ("RF") transceiver 154 may be coupled to analog signal processor 108. An RF switch 156 may be coupled to RF transceiver 154 and an antenna 158. In addition, a keypad 160, a mono headset with a microphone 162, and a vibrator device 164 may be coupled to analog signal processor 108.

A power supply 166 may be coupled to SoC 102 via a power management integrated circuit ("PMIC") 168. Power supply 166 may include a rechargeable battery or a DC power supply that is derived from an AC-to-DC transformer connected to an AC power source.

The CPU 104 may also be coupled to one or more internal, on-chip thermal sensors 170A as well as one or more external, off-chip thermal sensors 170B. The thermal sensors 170A and 170B may produce a voltage drop that is converted to digital signals with an analog-to-digital converter ("ADC") controller 222.

The touch screen display 114, the video port 120, the USB port 124, the camera 152, the first stereo speaker 138, the second stereo speaker 140, the microphone 144, the FM antenna 148, the stereo headphones 150, the RF switch 156, the RF antenna 172, the keypad 160, the mono headset 162, the vibrator 164, thermal sensors 170B, the PMIC 168, and the power supply 166 are external to the SoC 102 in this exemplary or illustrative embodiment. It will be understood, however, that in other embodiments one or more of these devices may be included in such an SoC.

The terms "normal operational mode" and "mission mode" are used synonymously herein to refer to any mode of operation of a device other than modes in which the device is undergoing configuration, provisioning, calibration, testing, booting, powering on or off, or similar transient operations. For example, in normal operational mode or mission mode, PCD 100 may perform those operations or functions that one of ordinary skill in the art recognizes are characteristic of a portable computing device, such as voice telephony, messaging, email, video and audio streaming or playback, etc. Such functions may be associated with applications. The term "traffic" may be used herein to refer to data that is produced, transmitted, received, or otherwise communicated or processed in association with mission-mode functions.

Figure 2:
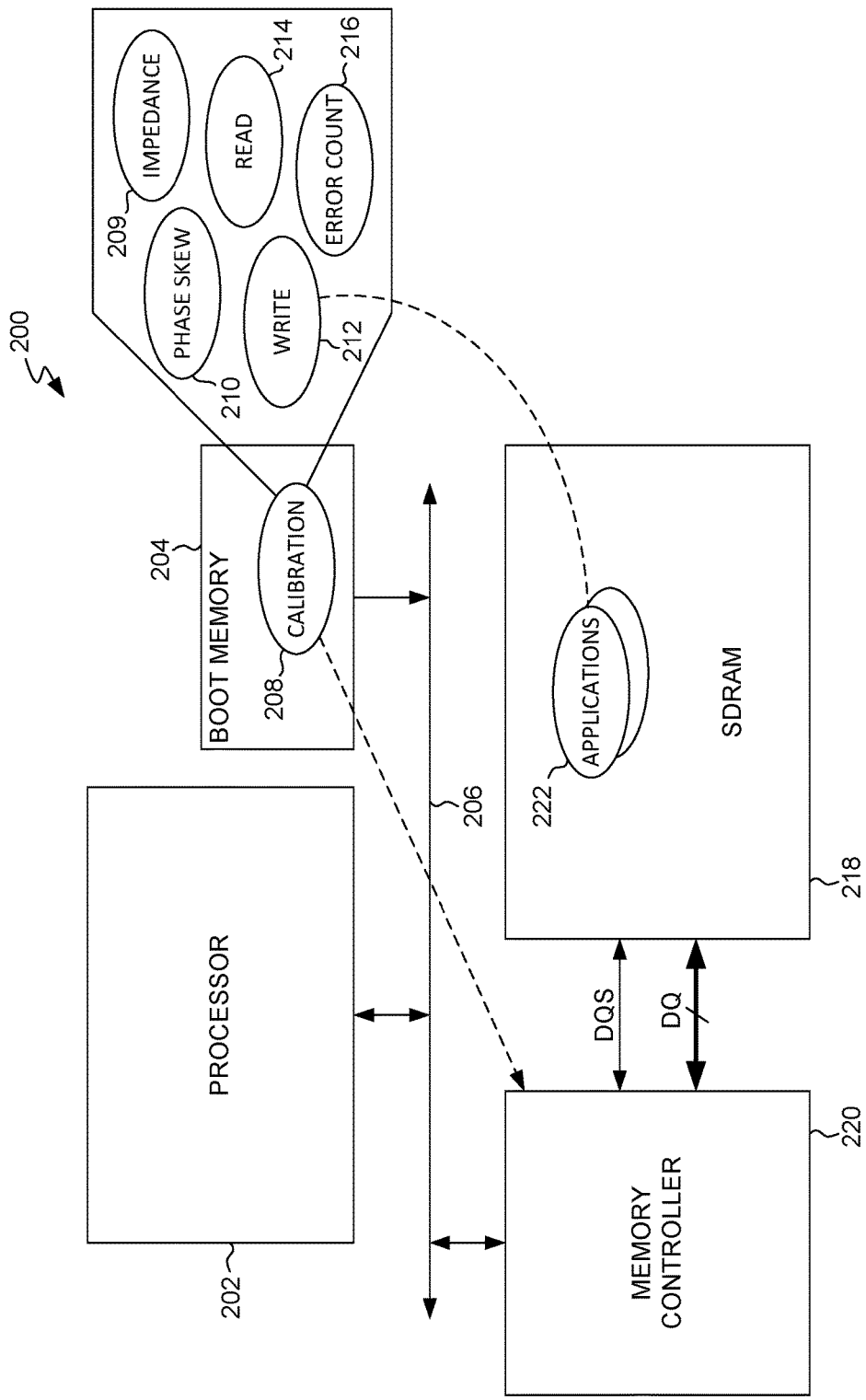
FIG. 2 is a block diagram of a processing system, in accordance with an exemplary embodiment.

As illustrated in FIG. 2, in an exemplary embodiment a processing system 200 includes a processor 202 and a non-volatile boot memory 204. Processor 202 and boot memory 204 may be a processor and memory, respectively, of PCD 100 (FIG. 1). For example, processor 202 may be CPU 104 of PCD 100. Memory 204 may be memory 128 of PCD 100, in which may be stored in non-volatile form software or firmware for, among other functions, booting PCD 100. Processor 202 and boot memory 204 may communicate signals with each other and with other devices via one or more interconnects 206, such as buses. In accordance with conventional computing principles, processor 202 operates under the control of software or firmware code, which configures processor 202 to perform various functions or methods, including the memory system calibration methods described herein. Through such code, processor 202 may be configured with calibration logic 208 related to the memory system calibration methods described herein. Calibration logic 208 may include impedance logic 209, phase skew logic 210, data write logic 212, data read logic 214, and error count logic 216. Although logic 208-216 is conceptually shown for purposes of illustration as stored or residing in boot memory 204 in the manner of software or firmware, it is understood that logic 208-216 arises in processing system 200 through the operation of processor 202 under the control of software or firmware, which may be stored in boot memory 204 or other memory. In operation, logic 208-216 defines a configuration of processor 202. Processor 202 is thus configured to perform the memory system calibration methods described herein. Although not shown in FIG. 2 for purposes of clarity, in addition to being configured to perform the memory system calibration methods described herein, processor 202 or processing system 200 may be configured to perform conventional methods, such as, for example, operating system methods, application program methods, etc. It should also be noted that the combination of logic 208-216 or related software elements and the non-transitory medium in which they are stored or reside (e.g., boot memory 204 or other memory) generally defines what is referred to in the patent lexicon as a "computer program product." Further, logic 208-216 defines means for performing the functions described below.

Processing system 200 further includes an SDRAM 218 and a memory controller 220. SDRAM 218 may be, for example, DDR SDRAM 130 of PCD 100 (FIG. 1). Memory controller 220 may be, for example, memory controller 132 of PCD 100. SDRAM 218 may be a system memory or main memory that is used by processor 202 in executing applications 222. The memory system calibration methods described herein relate to determining a phase skew between the data strobe ("DQS") and data ("DQ") signals, and configuring memory controller 220 with a corresponding phase skew value, as conceptually indicated by the broken-line arrow in FIG. 2. Processor 202, operating in accordance with such methods, may determine such phase skew values and effect their transfer or communication to memory controller 220 via interconnects 206.

Figure 3:
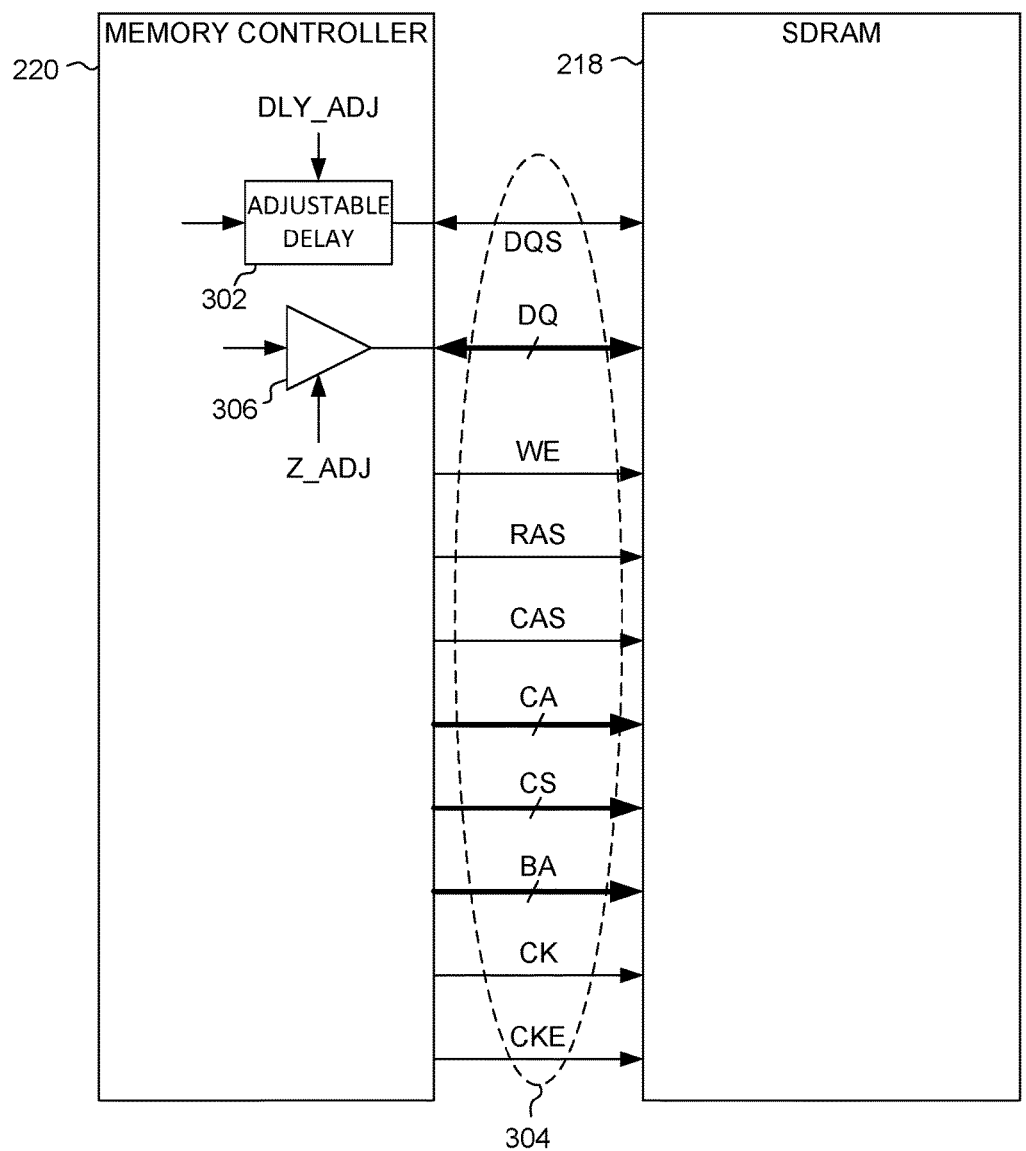
FIG. 3 is a block diagram of a memory system of the processing system, in accordance with an exemplary embodiment.

As illustrated in FIG. 3, memory controller 220 may use a phase skew value to adjust an adjustable delay element 302. Delay element 302 is configured to delay the DQS signal by an adjustable amount of time, which may correspond to the phase skew value. Memory controller 220 may generate the DQS signal in a conventional manner, as well understood by one of ordinary skill in the art, and provide the DQS signal to a signal input of delay element 302. Memory controller 220 may adjust delay element 302 by providing a delay value ("DLY_ADJ") to a delay adjustment input of delay element 302. In response to the delay value, delay element 302 outputs a delayed DQS signal that has been delayed from the DQS signal at the input of delay element 302 by an amount of time represented by the delay value. (The manner in which synchronization is provided between the DQ and DQS signals prior to delaying the DQS signal is well understood by one of ordinary skill in the art and therefore not described herein.) The delayed DQS signal at the output of delay element 302 is provided to SDRAM 218 via a bus 304. Although the DQ and DQS signals are bidirectional on bus 304, circuitry in memory controller 220 relating to DQ and DQS signals received via bus 304 is not shown for purposes of clarity.

Bus 304 may be of a conventional type employed in DDR SDRAM systems. Accordingly, bus 304 may include not only the DQS and DQ signals, but also a write enable ("WE") signal, a row address strobe ("RAS") signal, a column address strobe ("CAS") signal, command-and-address bus signals ("CA"), chip select signals ("CS"), bank address signals ("BA"), a clock ("CK") signal, a clock enable ("CKE") signal, or other signals commonly included in such DDR SDRAM system buses. Although some of these signals may be differential rather than single-ended, they are depicted as single-ended in FIG. 3 for purposes of clarity. As the manner in which these signals are generated and used in connection with write, read, and other memory operations is well understood by one of ordinary skill in the art, such aspects are not described herein.

Memory controller 220 also includes adjustable-impedance drivers 306 that provide outgoing DQ signals onto the bidirectional DQ signal line portions of bus 304. Drivers 306 are configured to have an adjustable output impedance. Memory controller 220 may generate the DQ signals in a conventional manner in association with a write operation, as well understood by one of ordinary skill in the art, and provide the DQ signals to signal inputs of adjustable-impedance drivers 306. Memory controller 220 may set or adjust the output impedance with which drivers 306 couple the DQ signals onto the DQ signal lines of bus 304 by providing an impedance value ("Z_ADJ") to an impedance adjustment input of drivers 306. The outputs of drivers 306 are provided to SDRAM 218 via the DQ signal line portions of bus 304.

The memory system calibration methods described herein include determining the impedance values to which the impedance of drivers 306 is set or adjusted. Processor 202, operating in accordance with such methods, may determine such impedance values and effect their transfer or communication to memory controller 220 via interconnects 206 (FIG. 2).

As the manner in which a DDR SDRAM bus operates to effect write, read, and other operations is well understood by one of ordinary skill in the art, such aspects are not described herein. Except for the aspects of memory controller 220 described herein, all other aspects of memory controller 220 may be conventional or otherwise readily apparent to one of ordinary skill in the art in view of the descriptions herein. Accordingly, such conventional aspects of the structure and operation of memory controller 220 are not described herein.

Impedance mismatch in the signal channel defined by the DQ signal line portions of bus 304 may adversely affect the signal integrity of the DQ signals by introducing ring-back noise. Poor signal integrity of incoming DQ signals at SDRAM 218 may result in write errors. An example of a DQ signal 402 that exhibits ring-back noise at SDRAM 218 is shown (in solid line) in the eye diagram 400 of FIG. 4. This example of a DQ signal 402 that exhibits ring-back noise may be contrasted with an example of a DQ signal 404 (shown in broken line) that does not exhibit ring-back noise. Note that the ring-back noise is most prominent in the exemplary DQ signal 402 near the center of the eye. If SDRAM 218 were to sample the exemplary DQ signal 402 near the center 406 of the eye (i.e., at a point in time 90 degrees from the start or transition 408 of the eye), where signal integrity is poor, a greater number of write errors could be expected than if SDRAM 218 were to sample the exemplary DQ signal 402 at a point in time at which signal integrity is better.

Figure 4:
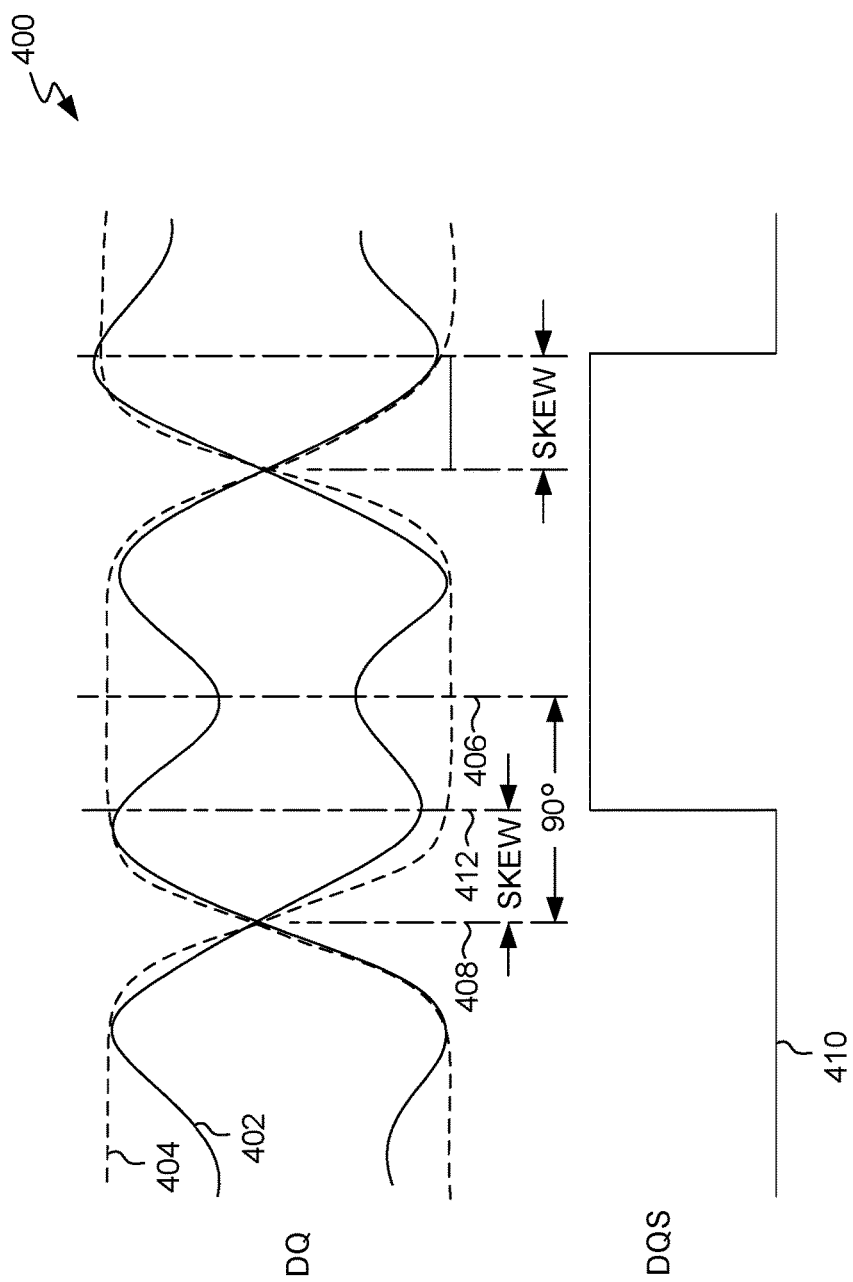
FIG. 4 is a waveform timing diagram of a data signal and a data strobe signal of the memory system, in accordance with an exemplary embodiment.

In accordance with the exemplary methods described below, processing system 200 (FIG. 2) calibrates the timing of the DQS signal with respect to the DQ signal so that the edges of the DQS signal coincide with a portion of the DQ signal having good signal integrity. An example of an optimal phase skew ("SKEW") determined in accordance with the exemplary methods is shown in FIG. 4. In FIG. 4, an example of a DQS signal 410 is shown that is delayed by an amount of time that provides the optimal phase skew between the edges of the DQS signal and a portion of the DQ signal having good signal integrity. In the manner described below, a portion of the DQ signal having good signal integrity is indirectly determined by iteratively performing system-level memory tests on SDRAM 218 (FIG. 2). The phase skew between the DQS and DQ signals is swept over a range. That is, each memory test or iteration corresponds to a discrete phase skew value in the range. The phase skew value corresponding to the memory test or iteration producing the lowest error count among all the memory tests is determined and selected as the above-described optimal phase skew value. Thus, for example, setting the phase skew between the exemplary DQS signal 410 and the exemplary DQ signal 402 to an optimal phase skew value "SKEW" as shown in FIG. 4 results in SDRAM 218 sampling the exemplary DQ signal 402 at a timepoint 412. That is, the sample is triggered by the rising edge of the exemplary DQS signal 402 at timepoint 412. Such sampling occurs in response to both rising and falling edges of the exemplary DQS signal 402, in accordance with DDR principles. In this example, as a result of setting the phase skew between the exemplary DQS signal 410 and the exemplary DQ signal 402 to the optimal phase skew value "SKEW," write operations are likely to result in fewer memory errors because the exemplary DQ signal 402 exhibits less ring-back noise at the sampling timepoint 412 than near the center 406 of the eye.

Figure 5:
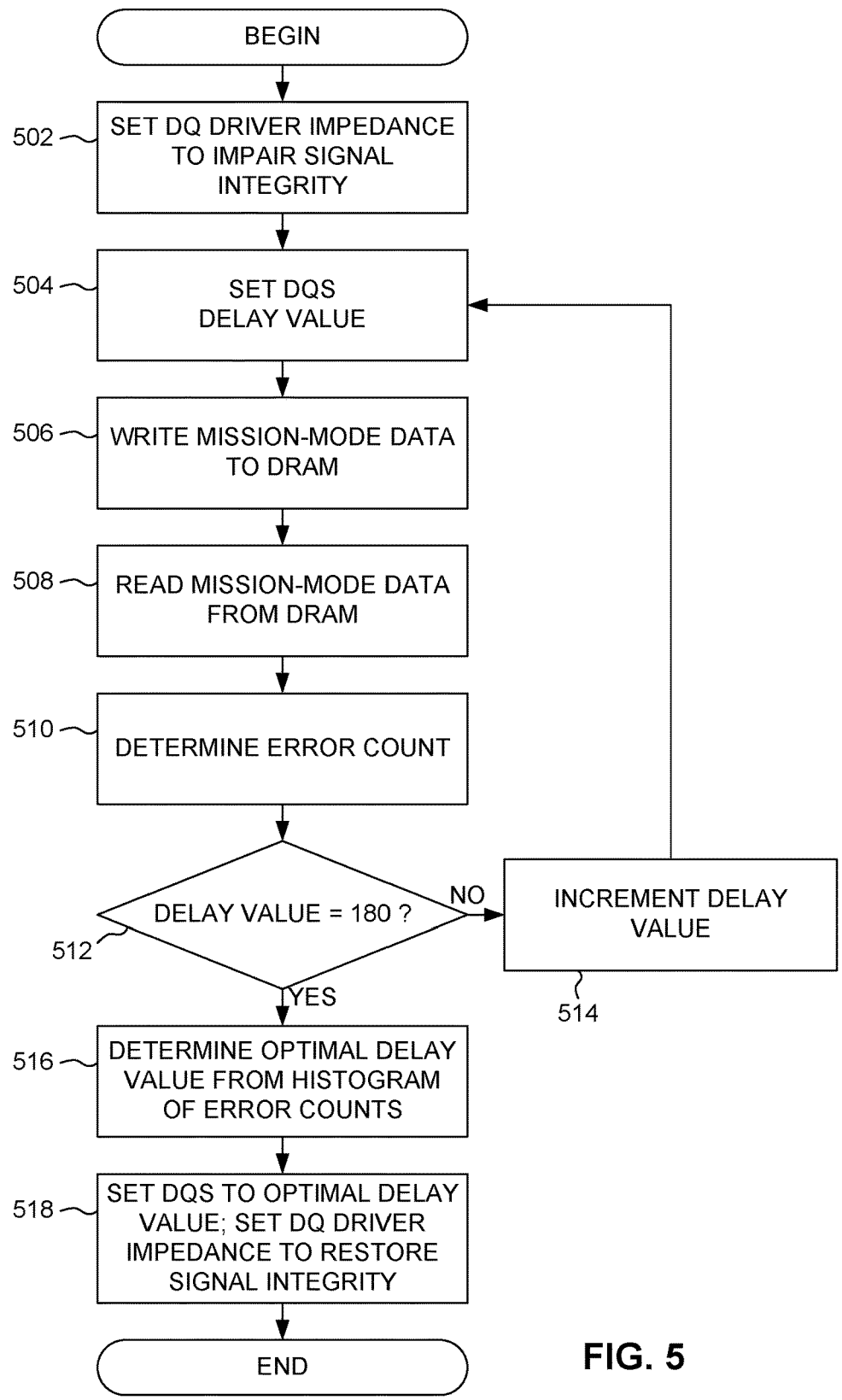
FIG. 5 is a flow diagram illustrating a method for memory system calibration, in accordance with an exemplary embodiment.

An exemplary method for controlling memory system calibration is illustrated by the flow diagram of FIG. 5. Although certain acts or steps in the methods described below naturally precede others for the exemplary embodiments to operate as described, the invention is not limited to the order of those acts or steps if such order or sequence does not alter the functionality of the invention. That is, it is recognized that some acts or steps may be performed before, after, or in parallel (i.e., substantially simultaneously) with other acts or steps without departing from the scope and spirit of the invention. In some instances, certain acts or steps may be omitted or not performed, without departing from the scope and spirit of the invention. Further, words such as "thereafter," "then," "next," etc., are not intended to limit the order of the acts or steps. Rather, such words are used to aid in guiding the reader through the descriptions of the exemplary methods.

As illustrated by the flow diagram of FIG. 5, in an exemplary embodiment the processing system 200 described above with regard to FIG. 2 may calibrate the timing of the DQS signal with respect to the DQ signal for write operations. The method may be performed substantially concurrently with conventional start-up methods that are performed in preparation for PCD 100 or other device beginning or returning to mission-mode operation. Performing such start-up methods is commonly referred to as bootstrapping or booting PCD 100 or such other device. Alternatively, or in addition, the methods may be performed at the time PCD 100 or such other device is manufactured.

As indicated by block 502, the exemplary method begins with adjusting or setting the output impedance of drivers 306 (FIG. 3). For example, processor 202 (FIG. 2) may provide memory controller 220 with an impedance value ("Z_ADJ"). Perhaps counterintuitively, the impedance of drivers 306 is set to an impedance value that may impair impedance matching on the DQ signal channel during the system-level memory tests that follow. That is, the impedance of drivers 306 is set to an impedance value that may introduce or exacerbate normally undesirable effects such as ring-back noise. An impedance value to which drivers 306 are set or adjusted may be determined by a method such as that described below with regard to FIG. 7 or other method. Impedance logic 209 (FIG. 2) may contribute to this function. Accordingly, processor system 200 or processor 202, as configured with impedance logic 209, may serve as a means for performing this function.

As indicated by block 504, the phase skew between the DQS and DQ signals is set or adjusted. For example, processor 202 may provide memory controller 220 with a delay value ("DLY_ADJ"). The amount of time by which the DQS signal is delayed from the DQ signals may be used as a proxy for the relative phase skew between the DQS and DQ signals because these signals are otherwise synchronized with each other. The method is performed in an iterative manner, with the delay value being swept from an initial value of, for example, zero degrees, to a final value of, for example, 180 degrees. The range of delay values may be divided into a sequence of discrete delay values, in increments of, for example, 10 degrees. Thus, for example, during the first iteration or memory test the corresponding delay value is set to 10 degrees; during the second iteration or memory test the corresponding delay value is set to 20 degrees; etc., through 180 degrees. Phase skew logic 210 may contribute to this function. Accordingly, processor system 200 or processor 202, as configured with phase skew logic 210, may serve as a means for performing this function.

As indicated by block 506, a plurality of data words are written to SDRAM 218. The data words may be representative of actual mission-mode data traffic that would be written to SDRAM 218. In this manner, the memory tests are performed under potentially adverse signal integrity conditions arising from effects such as crosstalk and power fluctuations that may arise under mission-mode operation but which may not arise under conventional memory test conditions, where short, predictable data patterns are written to and read from a memory in the absence of other activity in the device. Data write logic 212 may include portions that emulate portions of one or more of applications 222, as conceptually indicated by the broken-line connection in FIG. 2 between data write logic 212 and applications 222. Data write logic 212 may contribute to configuring processing system 200 or portions of PCD 100 to emulate aspects of mission-mode operation. In this manner, the writing of data to SDRAM 218 during the memory tests emulates the writing of data to SDRAM 218 during mission-mode operation of PCD 100. Processor system 200 or processor 202, as configured with data write logic 212, may serve as a means for performing this function.

As indicated by block 508, a plurality of data words are read from the same locations in SDRAM 218 as those to which the data words were written. In this description, the term "error" refers to a mismatch between a data word written to a memory location and a data word subsequently read from the same memory location. As used herein, the term "error count" or "pass/fail count" refers to the number of distinct errors resulting from a memory test. Data read logic 214 (FIG. 2) may contribute to this function. Accordingly, processor system 200 or processor 202, as configured with data read logic 214, may serve as a means for performing this function.

As indicated by block 510, the error count for the memory test is determined. Memory test errors may be detected in a variety of ways, such as comparing input and output data files, as well understood by one of ordinary skill in the art.

As indicated by block 512, it is determined whether the delay value provided to memory controller 220 as described above with regard to block 504 has reached 180 degrees, i.e., whether further iterations are to be performed. If it is determined (block 512) that further iterations are to be performed, then the delay value is incremented, as indicated by block 514, and the method continues at above-described block 504. Continuing at block 504, another memory test or iteration is then performed in the manner described above with regard to blocks 504-512.

Figure 6:
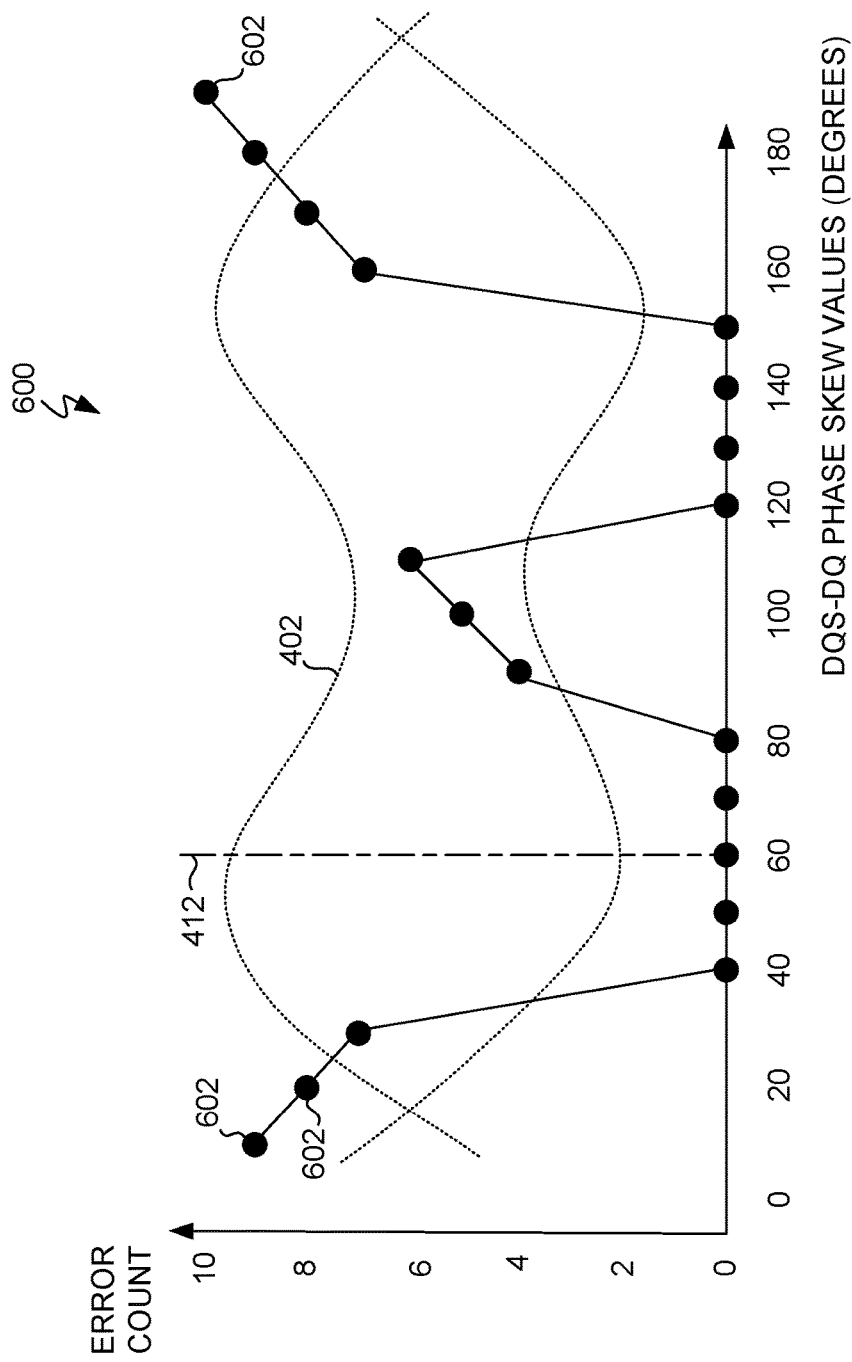
FIG. 6 is a histogram relating memory test error count to phase skew values between the data signal and data strobe signal, in accordance with an exemplary embodiment.

If it is determined (block 512) that no further iterations are to be performed, i.e., the delay value has been swept from 0 to 180 degrees, then an optimal delay value is determined from the error counts, as indicated by block 516. As shown in FIG. 6, a histogram 600 comprising points 602 may be used to determine the optimal delay value. Each point 602 represents a delay value and a corresponding error count. In FIG. 6, the exemplary DQ signal 402 is shown superimposed on histogram 600. The optimal delay value may be determined from the lowest error count. The lowest error count may be referred to as a "passing" error count for the memory tests. Error count logic 216 (FIG. 2) may contribute to these functions. Accordingly, processor system 200 or processor 202, as configured with error count logic 216, may serve as a means for performing these functions.

In some instances, there may be no more than one delay value that results in a minimum or lowest number of errors. However, FIG. 6 depicts an instance or example in which several delay values result in a minimum or lowest number of errors. In this example, among all the memory tests that were performed, the lowest number of errors occurred in the memory tests performed using corresponding delay values of 40, 50, 60, 70, 80, 120, 130, 140, and 150 degrees. The optimal delay value is selected from among these delay values by selecting a mid-point among a range of delay values. For example, 60 degrees may be selected as the optimal delay value because 60 is the mid-point between 40 and 80.

It can be noted that in this example there are two ranges of delay values that result in a minimum or lowest number of errors. That is, there are two passing ranges: 40-80 degrees, and 120-150 degrees. In the event that the memory tests result in two or more such passing ranges of delay values, then the optimal delay value may be selected from the largest of the passing ranges. In the example shown in FIG. 6, an optimal delay value may be selected from the passing range of 40-80 rather than the passing range of 120-150 because the passing range of 40-80 is larger than the passing range of 120-150.

Returning to FIG. 5, as indicated by block 518, the amount of time by which the DQS signal is to be delayed from the DQ signal is set to the optimal delay value. Processor 202 may provide memory controller 220 with the optimal delay value, and memory controller 220 may use the optimal delay value, in the manner described above with regard to block 504. Accordingly, memory controller 220 delays the DQS signal from the DQ signal by an amount of time represented by the optimal delay value, thereby producing the optimal phase skew between the DQS and DQ signals. When PCD 100 or other device subsequently begins or returns to mission mode, memory controller 220 delays the DQS signal accordingly in mission-mode write operations. Also, before entering mission mode, the impedance of drivers 306 is set to an impedance value that restores impedance matching on the DQ signal channel.

Figure 7:
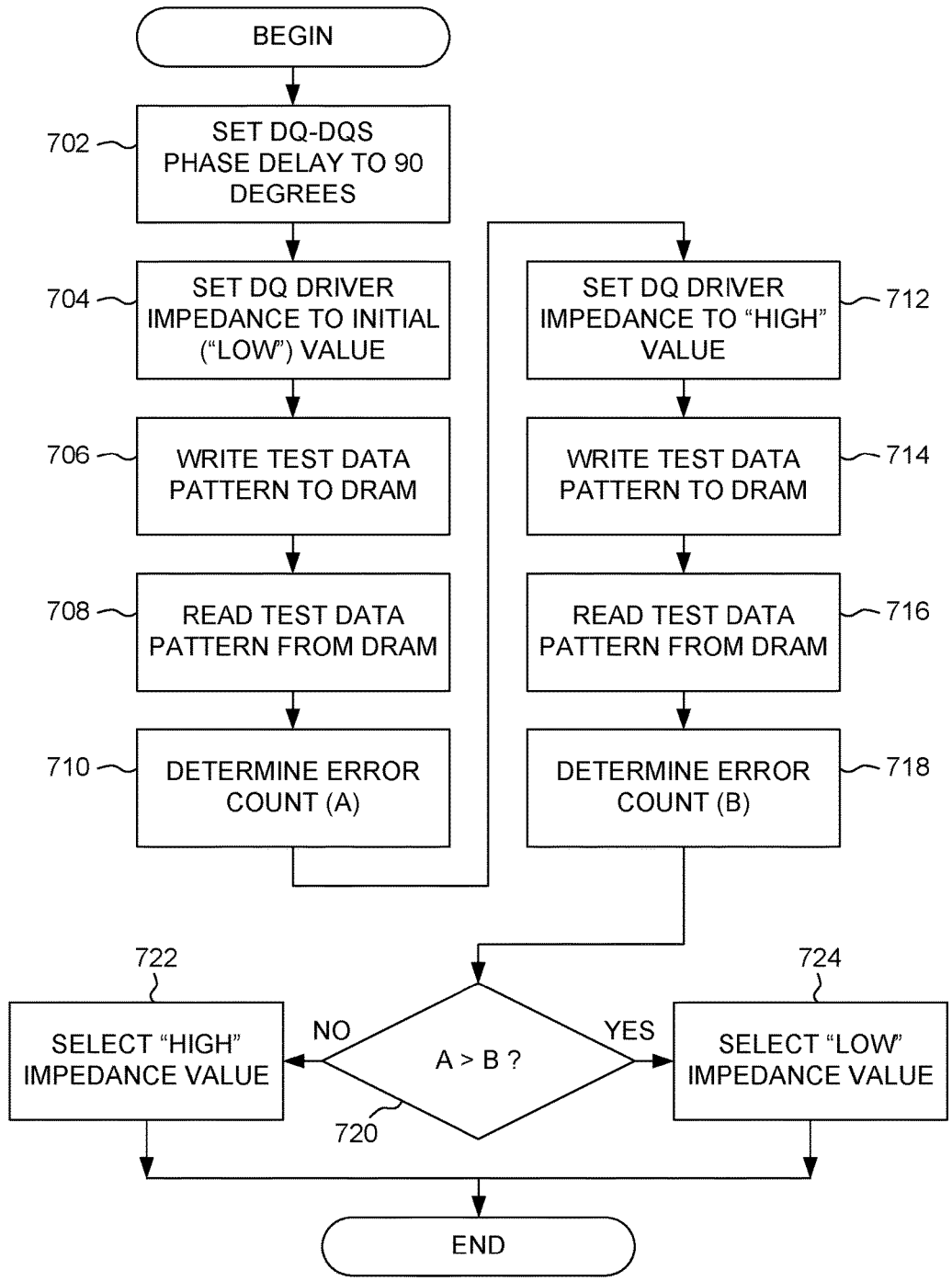
FIG. 7 is a flow diagram illustrating a method for determining a data signal driver impedance level that impairs impedance matching on the data channel, in accordance with an exemplary embodiment.

As illustrated in FIG. 7, one example of a way in which the operation indicated by block 502 (FIG. 5) may be performed or implemented involves determining how the error count responds to a change in driver impedance and selecting the driver impedance accordingly, so that impedance matching is impaired. That is, it is determined whether a higher driver impedance results in a higher error count than a lower driver impedance.

As indicated by block 702, the delay value is initialized or set (as described above with regard to block 504) to a value that is likely to result in a low (though not necessarily zero or minimum) error count when a memory test is performed. For example, the delay value may be set to 90 degrees. As described above with regard to FIG. 4, sampling the exemplary DQ signal 404, which is not subject to ring-back noise, crosstalk, or other adverse conditions, near the center 406 of the eye is likely to result in a low error count.

As indicated by block 704, the driver impedance is set (as described above with regard to block 502) to a low value. As used in this description, the terms "low value" and "high value" are intended to have no significance other than to indicate relative value with respect to each other; the high value is higher than the low value.

As indicated by block 706, a test data pattern is written to SDRAM 218. The test data pattern may comprise short data patterns of the type conventionally used to test memory systems. As indicated by block 708, the same memory locations to which the test pattern was written are read back. As indicated by block 710, an error count ("error count A") is determined.

As indicated by block 712, the driver impedance is then set (as described above with regard to block 502) to a high value. Blocks 714, 716, and 718, may be the same as blocks 706, 708, and 710, respectively. Thus, a test data pattern is written to memory locations in SDRAM 218, the memory locations are read, and an error count ("error count B") is determined.

As indicated by block 720, it is determined whether error count A is greater than error count B. If it is determined (block 720) that error count A is greater than error count B, then the high value is selected, as indicated by block 722. Subsequently, at block 502 (FIG. 5) the driver impedance is set to the selected high value. If it is determined (block 720) that error count A is not greater than error count B, then the low value is selected, as indicated by block 724. Subsequently, at block 502 (FIG. 5) the driver impedance is set to the selected low value. The method described above with regard to FIG. 7 is intended only as one example of how the manner in which the error count responds to changes, i.e., increases and decreases, in driver impedance can be determined. Others may occur readily to one of ordinary skill in the art in view of these descriptions and examples.

Alternative embodiments will become apparent to one of ordinary skill in the art to which the invention pertains without departing from its spirit and scope. Therefore, although selected aspects have been illustrated and described in detail, it will be understood that various substitutions and alterations may be made therein without departing from the spirit and scope of the present invention, as defined by the following claims.

What is claimed is:

1. A method for controlling memory system calibration, comprising:
   adjusting a data signal driver circuit to impair impedance matching on a data signal channel during a plurality of system-level memory tests;
   performing the plurality of system-level memory tests using a memory controller and a synchronous dynamic random access memory ("SDRAM"), each memory test corresponding to one of a plurality of phase skew values between a data strobe signal and a data signal on the data signal channel, each memory test comprising:
      setting a data strobe signal delay for the memory controller to correspond to one of the plurality of phase skew values;
      writing a plurality of data words to the SDRAM over the data signal channel;
      reading the plurality of data words from the SDRAM over the data signal channel; and
      determining an error count for the memory test, the error count indicating data mismatch errors between the plurality of data words read from the SDRAM and the plurality of data words written to the SDRAM;
   determining, following the plurality of system-level memory tests, an optimal phase skew value corresponding to a lowest error count among the plurality of system-level memory tests; and
   setting the data strobe signal delay for the memory controller to correspond to the optimal phase skew value.

2. The method of claim 1, wherein the plurality of data words simulate mission-mode data traffic.

3. The method of claim 2, wherein the mission-mode data traffic is based on one or more applications.

4. The method of claim 1, wherein adjusting a data signal driver circuit comprises:
   determining whether a higher memory test error count corresponds to a higher data signal driver circuit impedance or a lower data signal driver circuit impedance;
   increasing the data signal driver circuit impedance in response to a determination that a higher memory test error count corresponds to a higher data signal driver circuit impedance; and
   decreasing the data signal driver circuit impedance in response to a determination that a higher memory test error count corresponds to a lower data signal driver circuit impedance.

5. The method of claim 1, wherein determining an optimal phase skew value corresponding to a lowest error count comprises:
   determining a plurality of memory test passing ranges; and
   selecting the optimal phase skew value from a largest memory test passing range of the plurality of memory test passing ranges.

6. The method of claim 1, wherein the SDRAM comprises double data rate SDRAM ("DDR SDRAM").

7. The method of claim 1, wherein the memory system is included in a portable computing device ("PCD").

8. The method of claim 7, wherein the PCD comprises at least one of a mobile telephone, a personal digital assistant, a pager, a smartphone, a navigation device, and a hand-held computer with a wireless connection or link.

9. The method of claim 1, wherein adjusting the data signal driver circuit, performing the plurality of system-level memory tests, determining an optimal phase skew value, and setting the data strobe signal delay are performed during booting of the PCD.

10. The method of claim 1, wherein adjusting the data signal driver circuit, performing the plurality of system-level memory tests, determining an optimal phase skew value, and setting the data strobe signal delay are performed during manufacturing of the PCD.

11. A system for memory system calibration, the system comprising:
a memory system comprising a memory controller and a synchronous dynamic random access memory ("SDRAM"); and
one or more processors configured to:
adjust a data signal driver circuit to impair impedance matching on a data signal channel during a plurality of system-level memory tests;
perform the plurality of system-level memory tests, each memory test corresponding to one of a plurality of phase skew values between a data strobe signal and a data signal on the data signal channel, the one or more processors configured to, for each memory test:
set a data strobe signal delay for the memory controller to correspond to one of the plurality of the phase skew values;
write a plurality of data words to the SDRAM over the data signal channel;
read the plurality of data words from the SDRAM over the data signal channel; and
determine an error count for the memory test, the error count indicating data mismatch errors between the plurality of data words read from the SDRAM and the plurality of data words written to the SDRAM;
determine, following the plurality of system-level memory tests, an optimal phase skew value corresponding to a lowest error count among the plurality of system-level memory tests; and
set the data strobe signal delay for the memory controller to correspond to the optimal phase skew value.

12. The system of claim 11, wherein the plurality of data words simulate mission-mode data traffic.

13. The system of claim 12, wherein the mission-mode data traffic is based on one or more applications.

14. The system of claim 11, wherein the one or more processors are configured to adjust a data signal driver circuit by being configured to:
determine whether a higher memory test error count corresponds to a higher data signal driver circuit impedance or a lower data signal driver circuit impedance;
increase the data signal driver circuit impedance in response to a determination that a higher memory test error count corresponds to a higher data signal driver circuit impedance; and
decrease the data signal driver circuit impedance in response to a determination that a higher memory test error count corresponds to a lower data signal driver circuit impedance.

15. The system of claim 11, wherein the one or more processors are configured to determine an optimal phase skew value corresponding to a lowest error count by being configured to:
determine a plurality of memory test passing ranges; and
select the optimal phase skew value from a largest memory test passing range of the plurality of memory test passing ranges.

16. The system of claim 11, wherein the SDRAM comprises double data rate SDRAM ("DDR SDRAM").

17. The system of claim 11, wherein the memory system is included in a portable computing device ("PCD").

18. The system of claim 17, wherein the PCD comprises at least one of a mobile telephone, a personal digital assistant, a pager, a smartphone, a navigation device, and a hand-held computer with a wireless connection or link.

19. The system of claim 11, wherein the one or more processors are configured to adjust the data signal driver circuit, perform the plurality of system-level memory tests, determine an optimal phase skew value, and set the data strobe signal delay during booting of the PCD.

20. The system of claim 11, wherein the one or more processors are configured to adjust the data signal driver circuit, perform the plurality of system-level memory tests, determine an optimal phase skew value, and set the data strobe signal delay during manufacturing of the PCD.

21. A computer program product for controlling memory system calibration, the computer program product comprising processor-executable logic embodied in at least one non-transitory storage medium, execution of the logic by one or more processors of a system configuring the system to:
adjust a data signal driver circuit to impair impedance matching on a data signal channel during a plurality of system-level memory tests;
perform the plurality of system-level memory tests using a memory controller and a synchronous dynamic random access memory ("SDRAM"), each memory test corresponding to one of a plurality of phase skew values between a data strobe signal and a data signal on the data signal channel, the system being configured to, for each memory test:
set a data strobe signal delay for the memory controller to correspond to one of the plurality of the phase skew values;
write a plurality of data words to the SDRAM over the data signal channel;
read the plurality of data words from the SDRAM over the data signal channel; and
determine an error count for the memory test, the error count indicating data mismatch errors between the plurality of data words read from the SDRAM and the plurality of data words written to the SDRAM;
determine, following the plurality of system-level memory tests, an optimal phase skew value corresponding to a lowest error count among the plurality of system-level memory tests; and
set the data strobe signal delay for the memory controller to correspond to the optimal phase skew value.

22. The computer program product of claim 21, wherein the plurality of data words simulate mission-mode data traffic.

23. The computer program product of claim 22, wherein the mission-mode data traffic is based on one or more applications.

24. The computer program product of claim 21, wherein execution of the logic configures the system to adjust the data signal driver circuit by configuring the system to:
determine whether a higher memory test error count corresponds to a higher data signal driver circuit impedance or a lower data signal driver circuit impedance;
increase the data signal driver circuit impedance in response to a determination that a higher memory test error count corresponds to a higher data signal driver circuit impedance; and decrease the data signal driver circuit impedance in response to a determination that a higher memory test error count corresponds to a lower data signal driver circuit impedance.

25. The computer program product of claim 21, wherein execution of the logic configures the system to determine an optimal phase skew value corresponding to a lowest error count by configuring the system to:

determine a plurality of memory test passing ranges; and
select the optimal phase skew value from a largest memory test passing range of the plurality of memory test passing ranges.

26. The computer program product of claim 21, wherein the SDRAM comprises double data rate SDRAM ("DDR SDRAM").

27. The computer program product of claim 21, wherein the memory system is included in a portable computing device (PCD").

28. The computer program product of claim 27, wherein the PCD comprises at least one of a mobile telephone, a personal digital assistant, a pager, a smartphone, a navigation device, and a hand-held computer with a wireless connection or link.

29. The computer program product of claim 21, wherein execution of the logic configures the system to adjust the data signal driver circuit, perform the plurality of system-level memory tests, determine an optimal phase skew value, and set the data strobe signal delay during booting of the PCD.

30. A system for controlling memory system signal calibration, comprising:

means for adjusting a data signal driver circuit to impair impedance matching on a data signal channel during a plurality of system-level memory tests;

means for performing the plurality of system-level memory tests using a memory controller and a synchronous dynamic random access memory ("SDRAM"), each memory test corresponding to one of a plurality of phase skew values between a data strobe signal and a data signal on the data signal channel, the means for performing the plurality of system-level memory tests comprising, for each memory test:

means for setting a data strobe signal delay for the memory controller to correspond to one of the plurality of the phase skew values;
means for writing a plurality of data words to the SDRAM over the data signal channel;
means for reading the plurality of data words from the SDRAM over the data signal channel; and
means for determining an error count for the memory test, the error count indicating data mismatch errors between the plurality of data words read from the SDRAM and the plurality of data words written to the SDRAM;

means for determining, following the plurality of system-level memory tests, an optimal phase skew value corresponding to a lowest error count among the plurality of system-level memory tests; and means for setting the data strobe signal delay for the memory controller to correspond to the optimal phase skew value.

* * * * *